(12) United States Patent
Makita et al.

(10) Patent No.: US 7,583,158 B2
(45) Date of Patent: Sep. 1, 2009

(54) PWM SIGNAL GENERATING CIRCUIT

(75) Inventors: Mitsugu Makita, Nagoya (JP);
Yoshitaka Ojima, Toyota (JP);
Yoshinobu Kume, Seto (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 18 days.

(21) Appl. No.: 11/815,155

(22) PCT Filed: Sep. 12, 2006

(86) PCT No.: PCT/IB2006/002499

§ 371 (c)(1),
(2), (4) Date: Jul. 31, 2007

(87) PCT Pub. No.: WO2007/031840

PCT Pub. Date: Mar. 22, 2007

(65) Prior Publication Data

US 2008/0204161 A1    Aug. 28, 2008

(30) Foreign Application Priority Data

Sep. 13, 2005  (JP)  ............................... 2005-265826

(51) Int. Cl.
*H03K 7/08*   (2006.01)
*H03B 19/00*  (2006.01)
*H03K 3/04*   (2006.01)

(52) U.S. Cl. ...................... 332/109; 323/283; 327/113; 327/182

(58) Field of Classification Search ................ 332/109; 323/283; 375/376; 327/113, 182
See application file for complete search history.

(56) References Cited

U.S. PATENT DOCUMENTS

| 4,502,024 | A  | * | 2/1985  | Nishikawa et al. | 332/109 |
| 5,450,212 | A  | * | 9/1995  | Asada            | 358/3.02 |
| 5,838,193 | A  | * | 11/1998 | Myers et al.     | 330/10  |
| 6,023,199 | A  | * | 2/2000  | Cheung           | 332/109 |
| 6,310,913 | B1 | * | 10/2001 | Ishikawa         | 375/238 |
| 2003/0095013 | A1 | * | 5/2003 | Melanson et al. | 332/109 |
| 2004/0240583 | A1 | * | 12/2004 | Rauh et al.    | 375/297 |
| 2005/0212576 | A1 | * | 9/2005 | Shinohara       | 327/172 |

FOREIGN PATENT DOCUMENTS

| JP | 1 162791    | 11/1989 |
| JP | 8 289154    | 11/1996 |
| JP | 11 234519   | 8/1999  |
| JP | 11 330932   | 11/1999 |
| JP | 2001 169541 | 6/2001  |
| JP | 2004 345280 | 12/2004 |
| WO | 97 44899    | 11/1997 |

* cited by examiner

*Primary Examiner*—Joseph Chang
*Assistant Examiner*—Jeffrey Shin
(74) *Attorney, Agent, or Firm*—Oblon, Spivak, McClelland, Maier & Neustadt, P.C.

(57) ABSTRACT

A PWM signal generating circuit according to the invention includes a digital PWM signal generating circuit that generates a digital PWM signal having a resolution of 2n based on a clock signal CLK and n-bits (n≧1) of digital information; a triangular wave generator that generates a triangular wave (e.g. ramp wave) synchronized with the clock signal CLK; and a comparator that compares the triangular wave with a threshold value. The PWM signal generating circuit increases the resolution of the digital PWM signal based on an output from the comparator.

9 Claims, 6 Drawing Sheets

PWM SIGNAL GENERATING CIRCUIT

BACKGROUND OF THE INVENTION

1. Field of the Invention

The invention relates to a PWM signal generating circuit that is able to generate a high-resolution PWM signal without using a high-speed clock.

2. Description of the Related Art

A PWM wave generating circuit that controls an output voltage is described in, for example, Japanese Patent Application Publication No. JP-A-2001-169541. The PWM wave generating circuit described in this publication includes a constant current circuit in which a current value changes based on a feedback voltage; a capacitor that is charged with electric currents from the constant current circuit; a switch circuit that releases an electric charge of the capacitor; an A/D (analog-to-digital) converter that receives the feedback voltage and transmits a digital signal to a delay circuit; the delay circuit that receives the digital signal and controls the switch circuit; and a first comparator that controls a voltage of a PWM wave using the voltage in the capacitor.

Also, Japanese Patent Application Publication No. JP-A-2004-345280 describes a PWM signal generating circuit that has ON/OFF information used for generating a PWM signal that is able to be resolved into units for a reference clock, a counter that performs counting using the reference clock, and a selector circuit or a comparator circuit that selects the ON/OFF information corresponding to each count value that the counter may take and outputs the selected ON/OFF information. This PWM signal generating circuit is formed of a waveform synthetic circuit that forms a PWM signal by synthesizing a signal output from the selector circuit or the comparator circuit. The waveform synthetic circuit latches, using a base clock, the results obtained by computing the results of comparisons made by the comparator circuit or the results of selections made by the selector circuit within a time range that is equal to two or more units; further latches, using the base clock, the results each of which is obtained by computing at least two different results of latching; repeats the same operation until the latching becomes one; and uses the output of the one latching as the PWM signal of the basic clock resolution.

As with the configuration described in Japanese Patent Application Publication No. JP-A-2004-345280, in a common digital PWM signal generating circuit, a high-speed clock needs to be used in order to generate a high-resolution PWM signal. This increases the cost of the circuit configuration.

Meanwhile, in an analog PWM signal generating circuit, a leading and a triangular wave (e.g. a ramp wave), which are used to set a duty ratio of a PWM signal, are compared with each other. To generate a high-resolution PWM signal, a highly accurate reading and a good triangle wave need to be realized. Also, great attention needs to be given so that the reading and the triangle wave are not influenced by noise, etc. In addition, a comparator with low drift and low offset is usually expensive. This increases the cost of the circuit configuration, as with the digital PWM signal generating circuit.

With the art described above, the resolution of the PWM signal is attempted to be increased (discrete pulse duration is made continuous by a digital signal) by using an A/D converter that transmits a digital signal to the delay circuit. However, the resolution of the PWM signal is not uniformly increased with the art described above.

SUMMARY OF THE INVENTION

The invention provides a PWM signal generating circuit that is able to generate a high-resolution PWM signal without using a high-speed clock.

A first aspect of the invention relates to a PWM signal generating circuit including a digital PWM signal generating circuit that generates a digital PWM signal having a resolution of $2^n$ based on a clock signal CLK and n-bits ($n \geq 1$) of digital information; a triangular wave generator that generates a triangular wave synchronized with the clock signal CLK; and a comparator that compares the triangular wave with a threshold value. The PWM signal generating circuit increases the resolution of the digital PWM signal based on an output from the comparator.

In the PWM signal generating circuit according to the first aspect of the invention, the comparator may generate signals, of which a number equals to a number by which one cycle of the clock signal CLK is divided, based on a result of comparison between the triangular wave and the threshold value.

The PWM signal generating circuit according to the first aspect of the invention may further include a D/A converter that generates at least two threshold values based on at least 1-bit of digital information.

A second aspect of the invention relates to a PWM signal generating circuit including a counter that operates based on a clock signal CLK; a register that sets a duty ratio of a PWM signal; a first comparator that compares an output from the counter with an output from the register; a triangular wave generator that generates a triangular wave (e.g. a ramp wave) synchronized with the clock signal CLK; a second comparator that compares the triangular wave with a threshold value; and a signal generating circuit that generates the PWM signal based on the output from the counter, an output from the first comparator, and an output from the second comparator.

In the PWM signal generating circuit according to the second aspect of the invention, at least 1-bit of digital information that is compared with the output from the counter, and at least 1-bit of digital information used to generate at least two threshold values may be stored in the resistor.

The PWM signal generating circuit according to the first or the second aspect of the invention may further include a phase comparator that adjusts a difference in phase between the triangular wave and the clock signal CLK.

According to the first or the second aspect of the invention, it is possible to provide the PWM signal generating circuit that is able to generate the high-resolution PWM signal without using a high-speed clock.

BRIEF DESCRIPTION OF THE DRAWINGS

The foregoing and further objects, features and advantages of the invention will become apparent from the following description of example embodiments with reference to the accompanying drawings, wherein the same or corresponding portions will be denoted by the same reference numerals and wherein.

DETAILED DESCRIPTION OF THE EXAMPLE EMBODIMENTS

Hereafter, embodiments of the invention will be described in detail with reference to accompanying drawings.

Figure 1:
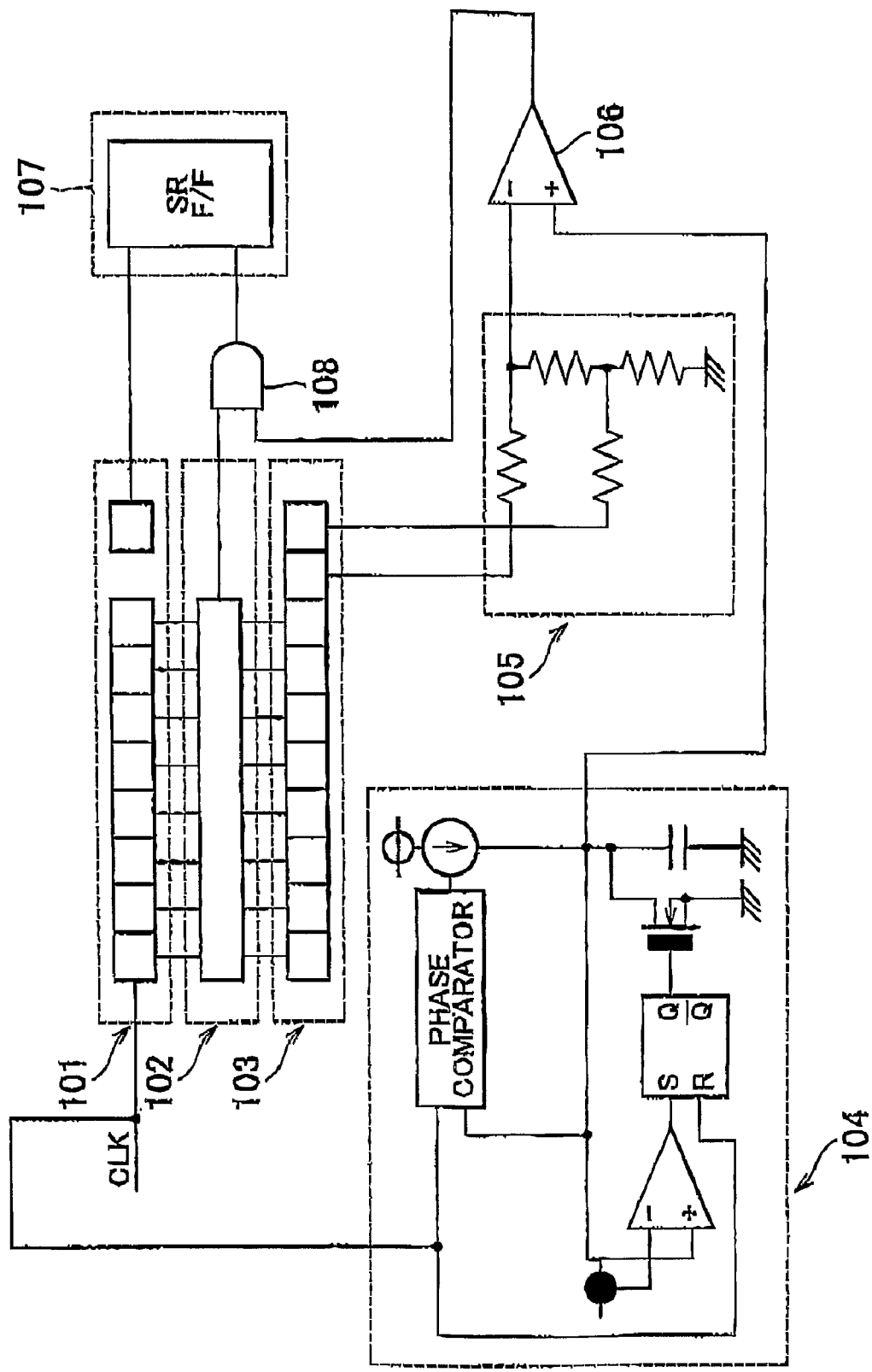
FIG. 1 is the view showing a PWM signal generating circuit according to an embodiment of the invention.

First, a PWM signal generating circuit according to the invention will be described with reference to FIG 1. FIG. 1 shows a counter 101, a comparator 102, a duty ratio setting register 103, a ramp wave generator 104, a D/A converter 105, a comparator 106, a flip-flop 107, and an AND circuit 108.

The counter 101 is incremented on each leading or trailing edge of a clock signal CLK. When the counter 101 overflows, a signal indicating "H" is output. In the example shown in the figure, the counter 101 is an 8-bit up-counter.

The comparator 102 compares an output from the duty ratio setting register 103 with an output from the counter 101. If the output from the duty ratio setting register 103 matches the output from the counter 101, the comparator 102 outputs a signal indicating "H". In the example shown in the figure, the duty ratio setting register 103 stores 10-bits of digital information (digital information used to set a duty ratio). The 8 bits at the high end of the data are compared with the output from the counter 101. The output from the duty ratio setting register 103 (stored data) is changed based on an output from a decoder (not shown) (namely, the digital information used to set the duty ratio is externally provided).

As shown in the figure, the ramp wave generator 104 generates, using, for example, a phase comparator, a ramp wave synchronized with the leading or trailing edge of the clock signal CLK. The inclination of the ramp wave is set, for example, to an inclination at which the voltage, which equals to the sum of the maximum output voltage from the D/A converter 105 and 1 LSB (V), is achieved in one cycle of the ramp wave (namely, one cycle of the clock signal CLK).

The D/A converter 105 converts the 2-bits at the low end of the digital information (2LSB) stored in the duty ratio setting register 103 into analog data. The comparator 106 compares the ramp wave generated by the ramp wave generator 104 with the output from the D/A converter 105 (the output from the duty ratio setting register 103, which has been converted into analog data). If the ramp wave is greater than the output from the D/A converter 105, the comparator 106 outputs a signal indicating "H". In the example shown in the figure, the comparator 106 is an analog comparator formed of an operational amplifier. Hereafter, the comparator 102 will be referred to as the "first comparator 102", and the comparator 106 will be referred to as the "second comparator 106", for the sake of quick identification.

The output from the first comparator 102 and the output from the second comparator 106 are both input in the AND circuit 108. The AND circuit 108 outputs a signal indicating "H", when the output from the first comparator 102 matches the output from the second comparator 106.

The flip-flop 107 is set when the counter 101 overflows or is reset to zero, and is reset when the signal indicating "H" is output from the first comparator 102 and the signs indicating "H" is output from the second comparator 106. In the example shown in the figure, the flip-flop 107 is an RS flip-flop. The output from the counter 101 (more specifically, the pulse formed by a one-shot circuit when the counter 101 overflows or is reset to zero) is input in the S input portion of the flip-flop 107. The output from the AND circuit 108 is input in the R input portion of the flip-flop 107.

If the signal output from the second comparator 106 always indicates "H" (namely, if the output from the first comparator 102 is input, as it is, in the R input portion of the flip-flop 107), a common digital PWM signal generating circuit, in which the duty ratio is controlled based on the 8 bits at the high end of the information stored in the duty ratio setting register 103 (in this case, a digital PWM signal having a resolution of 28 is generated), is configured.

According to the embodiment of the invention described above, the second comparator 106 compares the ramp wave, of which one cycle is synchronized with one cycle of the clock signal CLK, with two or more voltage values (threshold values) that are generated by converting the digital information stored in the duty ratio setting register 103 into analog data. Accordingly, the signal output from the second comparator 106 is switched between the signal indicating "H" and the signal indicating "L" based on the result of comparison. In other words, the signal output from the second comparator 106 is flexibly switched between the signal indicating "H" and the signal indicating "L" in one cycle of the clock signal CLK based on the digital information stored in the duty ratio setting register 103. For example, when four voltage values (threshold values) are generated based on the 2-bits at the low end of the digital information stored in the duty ratio setting register 103 as shown in the figure, the signal output from the second comparator 106 (and the signal input in the R input portion of the flip-flop 107) can be flexibly switched between the signal indicating "H" and the signal indicating "L" in a cycle obtained by dividing one cycle of the clock signal CLK by four (in this case, a PWM signal having a resolution of $2^8 \times 4$ can be generated).

According to the embodiment of the invention described above, the signals, of which the number equals to the number by which one cycle of the clock signal CLK is divided, can be generated using the output from the second comparator 106 that compares the ramp wave with the output from the D/A converter 105. For example, a high-speed clock of approximately 1.6 GHz ($100 \times 2^{14}$ kHz) is usually required to generate a PWM signal having a resolution of 14-bits at 100 kHz using only a digital PWM signal generating circuit. However, according to the embodiment of the invention, if the resolution of 8-bits is achieved by digital and the resolution of 6-bits ($2^6$ units of threshold values) is achieved by analog, the resolution of 14-bits can be achieved by a clock of approximately 26 MHz. Also, if the difference between the minimum value and the maximum value of the voltage of the ramp wave is 5V, the relationship between the voltage of the ramp wave and threshold values, of which number is $2^6$, is such that the voltage of the ramp wave per 1 LSB is approximately 78 mV ($5000/2^6$ mV). Accordingly, a lot of attention need not to be given to the linearity of the ramp wave and offset and drift in the second comparator 106. As a result, a robust circuit can be realized.

Figure 2:
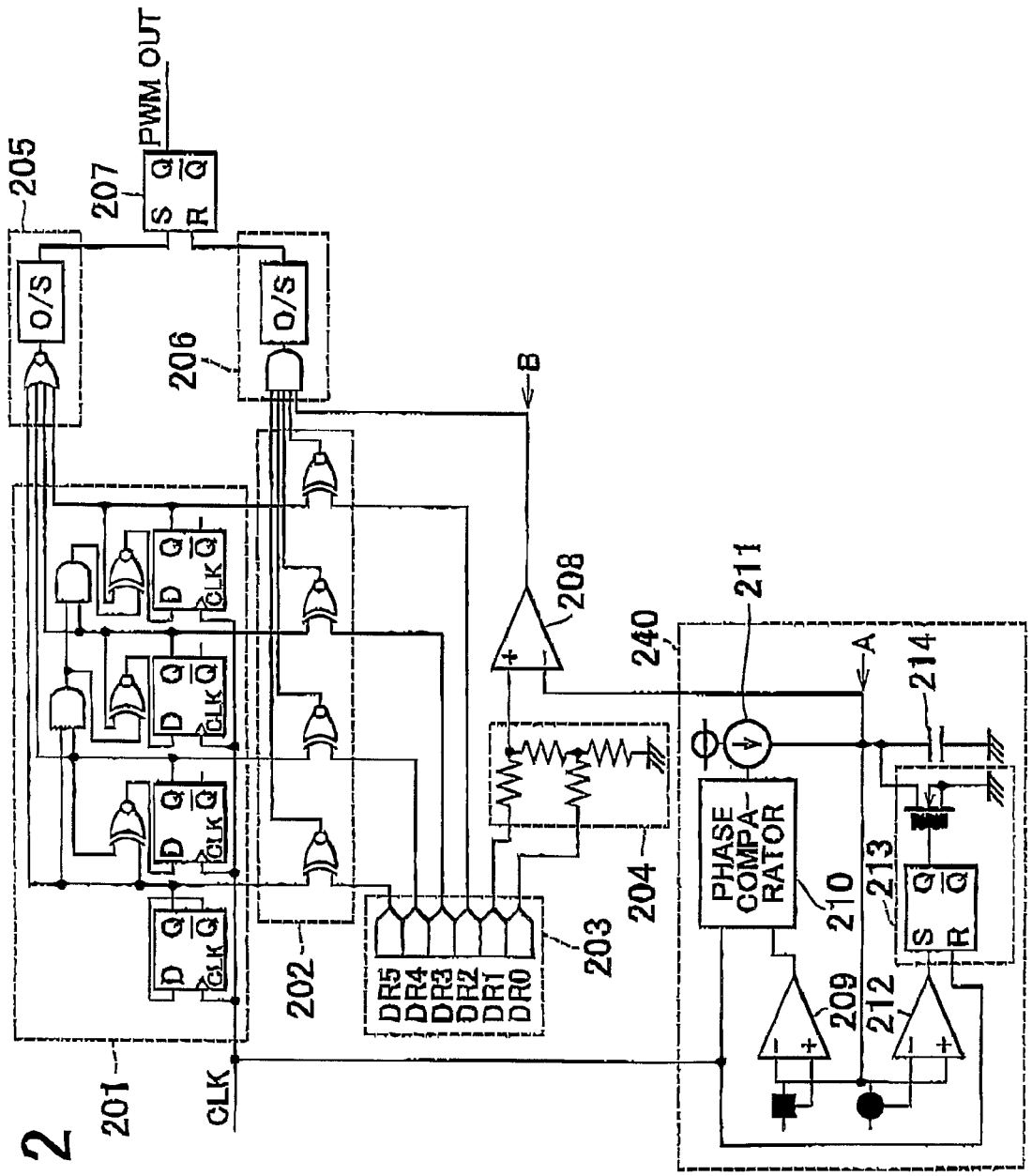
FIG. 2 is the view showing, in more detail, the structure of the PWM signal generating circuit in FIG. 1.

Next, more detailed description will be given with reference to FIG. 2 and the following figures. FIG. 2 shows a 4-bit up-counter 201 including four D flip-flops arranged on respective four stages, a comparator 202, a duty ratio setting register 203, a D/A converter 204, a NOR circuit 205, an AND circuit 206, a flip-flop 207, a comparator 209, a comparator 212, and a ramp wave generator 240. The up-counter 201 is a synchronous counter in which the clock signal CLK is input in the CLK input portion of the D flip-flop arranged on each stage. The Q output portion of each D flip-flop is connected to the NOR circuit 205. The counter used in the invention is not limited to the counter of this type. Any types of counters that operate based on the clock signal CLK may be used.

The duty ratio setting register 203 is a 6-bit register. The duty ratio setting data stored in the duty ratio setting register 203 is changed based on the input data from a decoder (not shown) with respect to each predetermined carrier frequency.

The comparator 202 (hereinafter, referred to as the "first comparator 202") compares outputs DR2 to DR5 (4-bits at the high end) from the duty ratio setting register 203 with the values of the counter 201. More specifically, the first comparator 202 is a comparison circuit formed of four XNOR circuits that output XNOR of the outputs of Q of the D flip-flops and the respective outputs DR2 to DR5 from the duty ratio setting register 203.

The NOR circuit 205 is a circuit including a one-shot circuit that generates pulses when the value of the counter 201 becomes zero.

The AND circuit 206 is a circuit including a one-shot circuit that generates pulses based on the comparison results obtained by the comparator 202 and a comparator 208 (hereafter, referred to as a "second comparator 208").

The flip-flop 207 generates a PWM signal using pulses output from the NOR circuit 205 and the AND circuit 206. The output portion of the NOR circuit 205 is connected to the S input portion of the flip-flop 207, and the output portion of the AND circuit 206 is connected to the R input portion of the flip-flop 207.

The D/A converter 204 converts the digital outputs DR0, DR1 (2-bits at the low end) from the duty ratio setting register 203 into analog data, and inputs the analog data in the second comparator 208. The second comparator 208 outputs a signal indicating "H", if the voltage of the ramp wave is greater than the output from the D/A converter 204.

The ramp wave generator 240 generates the ramp wave that is synchronized with the leading edge or the trailing edge of the clock signal CLK using, for example, a phase comparator 210. The inclination of the ramp wave is set to an inclination at which the voltage, which equals to the sum of the maximum output voltage from the D/A converter 204 and 1 LSB (V), is achieved in one cycle of the ramp wave (namely, one cycle of the clock signal CLK).

When detecting the voltage, which equals to the sum of the maximum output voltage from the D/A converter 105 and ½ LSB (v), and the comparator 212 resets the voltage of the ramp wave using a reset circuit 213.

The comparator 209 compares the voltage of the ramp wave generated by a voltage control current source 211, a capacitor 214, and the reset circuit 213 with ½ Vcc. The comparator 210 is a phase comparator. The phase comparator 210 compares the phase of the clock signal CLK with the phase of the pulse generated by the comparator 209, and adjusts the electric current from the voltage control current source 211 to correct the deviation of the phase. This will be described in detail with reference to FIG. 3.

Figures 3A, 3B:
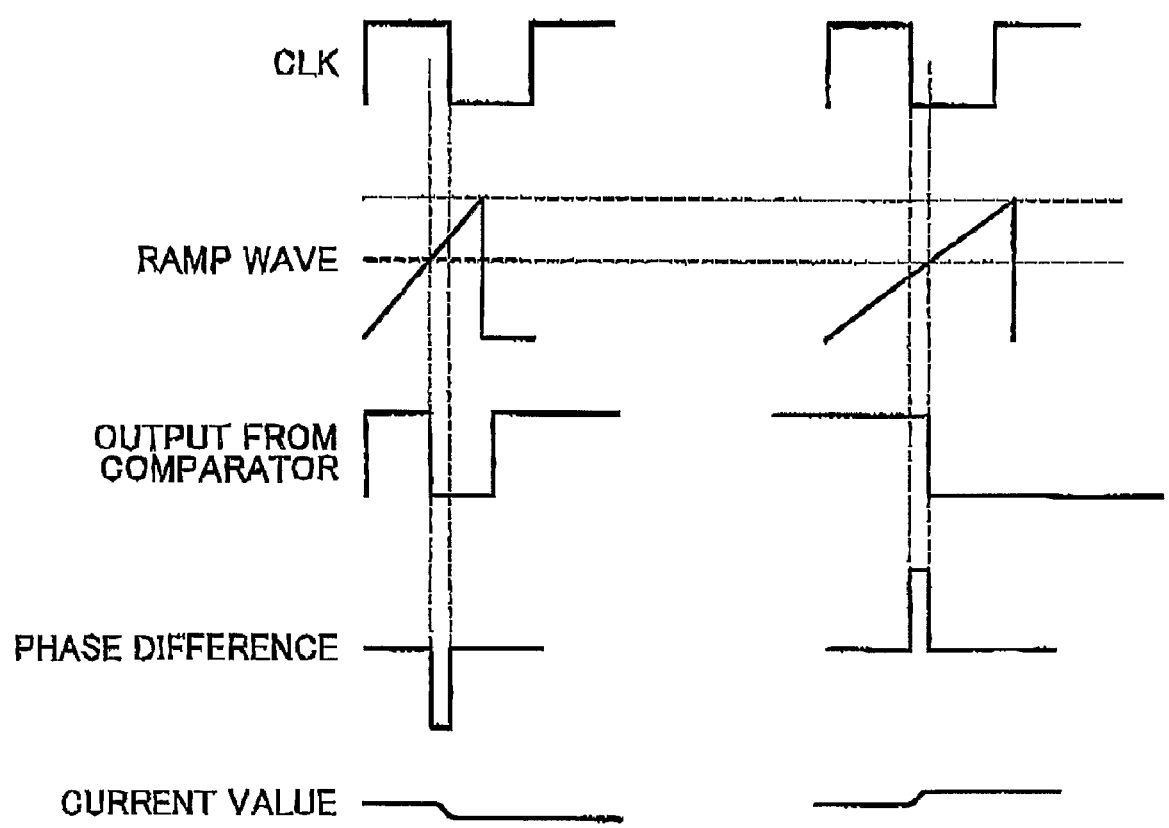
FIGS. 3A and 3B each illustrate the timing chart showing the manner in which a phase is adjusted by a phase comparator 210.

FIGS. 3A and 3B each illustrate the timing chart showing, beginning at the top, the waveform of the clock signal CLK, the waveform of the ramp wave (before adjustment of the phase), the output waveform from the comparator 209, the difference in the phase between the clock signal CLK and the output from the comparator 209 (in the embodiment of the invention, the difference in phase between the time at which the output of the ramp wave is ½ Vcc and the trailing edge of the clock signal CLK), and the electric current from the voltage control current source 211. FIG. 3A shows the state where the phase of the ramp wave is advanced. FIG. 3B shows the state where the phase of the ramp wave is retarded.

When the phase of the ramp wave is advanced as shown in FIG. 3A, the phase comparator 210 retards the phase of the ramp wave by reducing the electric current from the voltage control current source 211. On the other hand, when the phase of the ramp wave is retarded as shown in FIG. 3B, the phase comparator 210 advances the phase of the ramp wave by increasing the electric current from the voltage control current source 211. Thus, the phase comparator 210 can flexibly change the difference in the phase between the ramp wave and the clock signal CLK while bringing the ramp wave and the clock signal CLK into synchronization. In the embodiment of the invention, adjustment is made so that the phase at which the output of the ramp wave is ½ Vcc matches the trailing edge of the clock signal, in order to efficiently use the portion of the ramp portion, where best linearity is obtained. Alternatively, the output of the ramp portion other than the ½ VCC may be synchronized with the trailing edge (or the leading edge) of the clock signal CLK. In the embodiment of the invention, because the phase retardation of the logical circuit arranged on the latter stage is not taken into account, the time at which the output of the ramp wave is ½ VCC completely matches the trailing edge of the clock signal CLK. However, the phase of the ramp wave may be advanced to compensate for the phase retardation of the logical circuit arranged on the latter stage.

Figure 4:
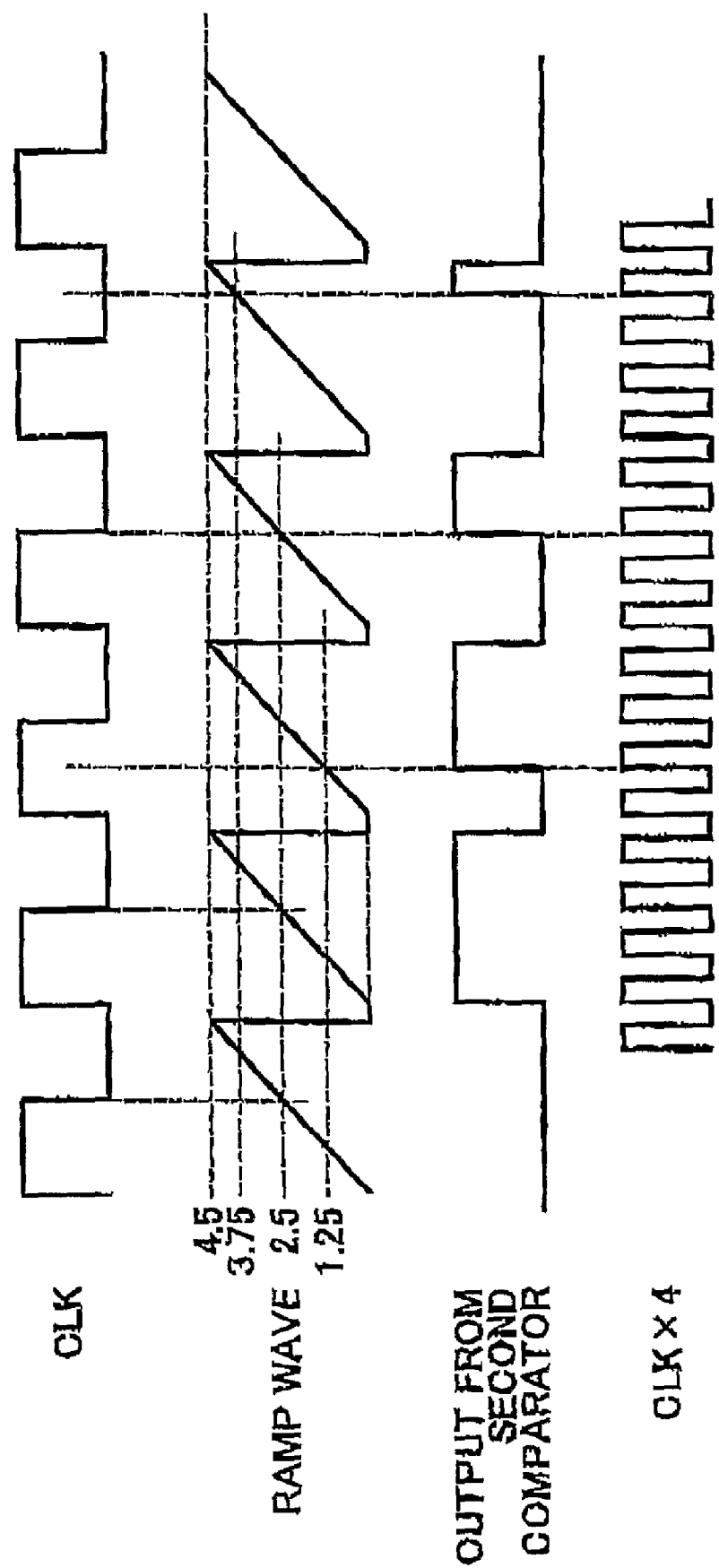
FIG. 4 is the timing chart showing the manner in which an output waveform from a second comparator 208 (a waveform at a point B in FIG. 2) is formed when the PWM signal generating circuit in FIG. 2 is operating.

FIG. 4 shows the manner in which the output waveform (the waveform at a point B in FIG. 2) from the second comparator 208 is formed when the PWM signal generating circuit shown in FIG. 2 is operating.

FIG. 4 shows, beginning at the top, the waveform of the clock signal CLK, the waveform of the ramp wave (after the phase is adjusted by the phase comparator 210), the output waveform from the second comparator 208 (the waveform at the point B in FIG. 2), and the wave form of which the frequency equals to the value obtained by multiplying the frequency of the clock signal CLK by four (CLK×4). At 4.5 (V), the ramp wave shown in FIG. 4 is reset by the reset circuit 213.

FIG. 4 shows four threshold values (1.25 (V) per 1 LSB: four values of 0 (V), 1.25 (V), 2.5 (V), and 3.75 (V)) for the waveform of the ramp wave. As described above, the four threshold values are generated by converting the digital outputs DR0, DR1 from the duty ratio setting register 203 into analog data. Accordingly, there are four types of pulse durations of the output waveform from the second comparator 208 (durations during which the signal indicating "H" is output) corresponding to the respective four threshold values. Namely, as shown by the output waveform from the second comparator 208 in FIG. 4, as the threshold value is increased from 1.25 (V) to 2.5 (V), and to 3.75 (V), the pulse duration is gradually decreased toward the right side in stages, as compared with the pulse duration (the far left pulse duration in FIG. 4) when the threshold value is 0. Therefore, if the PWM signal is generated using the output waveform from the second comparator 208, even when the clock signal CLK is used, it is possible to generate the PWM signal having the same resolution as that when a quad-speed clock (CLK×4) is used.

Figure 5:
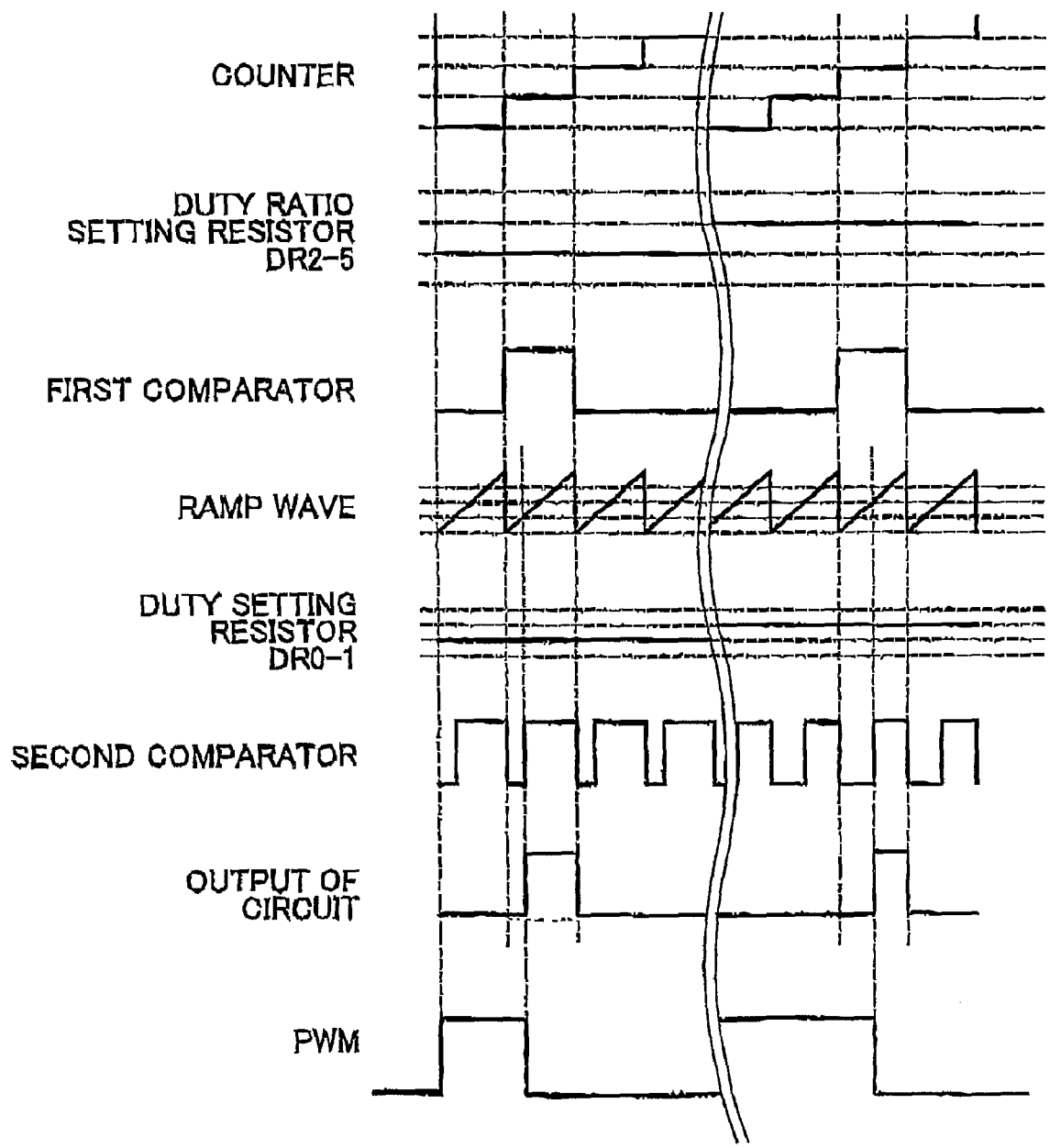
FIG. 5 is the timing chart schematically showing the manner in which a PWM signal is generated by the PWM signal generating circuit in FIG. 2.

FIG. 5 is the view schematically showing the manner in which the PWM signal is generated by the PWM signal generating circuit in FIG. 2.

FIG. 5 shows, beginning at the top, the value of the counter 201 (2LSB), the outputs from the duty ratio setting register 203 (2LSB for DR2 to DR5), the output waveform from the first comparator 202, the waveform of the ramp wave (after the phase is adjusted by the phase comparator 210), the outputs from the duty ratio setting register 203 (DR0, DR1), the output waveform from the second comparator 208 (the waveform at the point B in FIG. 2), the output from the AND circuit 206, and the Q output from the flip-flop 207 (the generated PWM signal).

In FIG. 5, the outputs from the duty ratio setting register 203 (DR0 to DR5) are changed at each cycle (clock cycle of 16×1, in the embodiment) of the carrier frequencies of the PWM signal.

The signal indicating "H" is output from the first comparator 202 while the output from the duty ratio setting register 203 matches the output from the counter 201, as shown in FIG. 5. In the example shown in the figure, the outputs (DR2 to DR5) from the duty ratio setting register 203 are changed between the first cycle and the second cycle of the carrier frequencies. Accordingly, the time at which the signal indicating "H" is output is changed. Namely, the signal indicating "H" is output from the first comparator 202 at the time at which the counter value becomes "2" in the first cycle of the carrier frequencies. The signal indicating "H" is output from the second comparator 202 at the time at which the counter value becomes "3" in the second cycle of the carrier frequencies.

Meanwhile, the output waveform from the second comparator 208 becomes "H", when the voltage of the ramp wave exceeds the outputs from the duty ratio setting register (DR0, DR1), as shown in FIG. 5. In the example, because the outputs from the duty ratio setting register 203 (DR2 to DR5) are changed between the first cycle and the second cycle of the carrier frequencies (because the threshold value is changed, for example, from 1.25 (V) to 2.5 (V) due to the change in the outputs), the time at which the signal indicating "H" is output and the pulse duration are changed. The signal indicating "H" is output from the second comparator 208 after approximately ¼ of the cycle of the clock signal CLK has elapsed in the first cycle of the carrier frequencies, and the signal indicating "H" is output from the second comparator 208 after approximately ½ of the cycle of the clock signal CLK has elapsed in the second cycle of the carrier frequencies. Also, the pulse duration during which the signal indicating "H" is output from the second comparator 208 becomes the duration of approximately ¾ of the cycle of the clock signal CLK in the first cycle of the carrier frequencies. The pulse duration during which the signal indicating "H" is output from the second comparator 208 becomes the duration of approximately ½ of the cycle of the clock signal CLK in the second cycle of the carrier frequencies.

As shown in FIG. 5, the signal indicating "H" is output from the AND circuit 206 approximately ¼ clock time behind the time at which the counter value becomes "2", and maintained for approximately ¾ clock time in the first cycle of the carrier frequencies. Also, the signal indicating "H" is output from the AND circuit 206 approximately ½ clock time behind the time at which the counter value becomes "3", and maintained for approximately ½ clock time in the second cycle of the carrier frequencies.

As a result, as shown in FIG. 5, the generated PWM signal (the Q output from the flip-flop 207: PWM output) is set and turned ON at the time at which the counter value becomes "0" in the first cycle of the carrier frequencies, and turned OFF after approximately 5/4 clock time has elapsed (at the leading edge of the AND circuit 206). Also, the generated PWM signal is set and turned ON at the time at which the counter value becomes "0" in the second cycle of the carrier frequencies, and turned OFF after approximately 5/2 clock time has elapsed.

According to the embodiment of the invention described above, the clock cycle (the time among 16 times that are obtained by diving one carrier cycle by 16) in which the generated PWM signal is turned OFF can be flexibly changed based on the outputs (DR2 to DR5) from the duty setting register 203. In addition, the time in the clock cycle (the time among four times that are obtained by dividing one clock cycle by four), at which the PWM signal is turned OFF, can be flexibly changed based on the outputs (DR0 to DR1) from the duty setting register 203.

Therefore, according to the embodiment of the invention described above, the signals, of which the number equals to the number by which one cycle of the clock signal CLK is divided, can be generated. Accordingly, it is possible to realize the PWM signal generating circuit that can generate a high-resolution PWM signal without using a high-speed clock.

In the embodiment of the invention described above, the time at which the PWM signal is turned OFF is set based on the output from the AND circuit 206. Alternatively, the output portion of the NOR circuit 205 may be connected to the R input portion of the flip-flop 207, and the output portion of the AND circuit 206 may be connected to the S input portion of the flip-flop 207, whereby the time at which the PWM signal is turned ON is set based on the output from the AND circuit 206.

Figure 6:
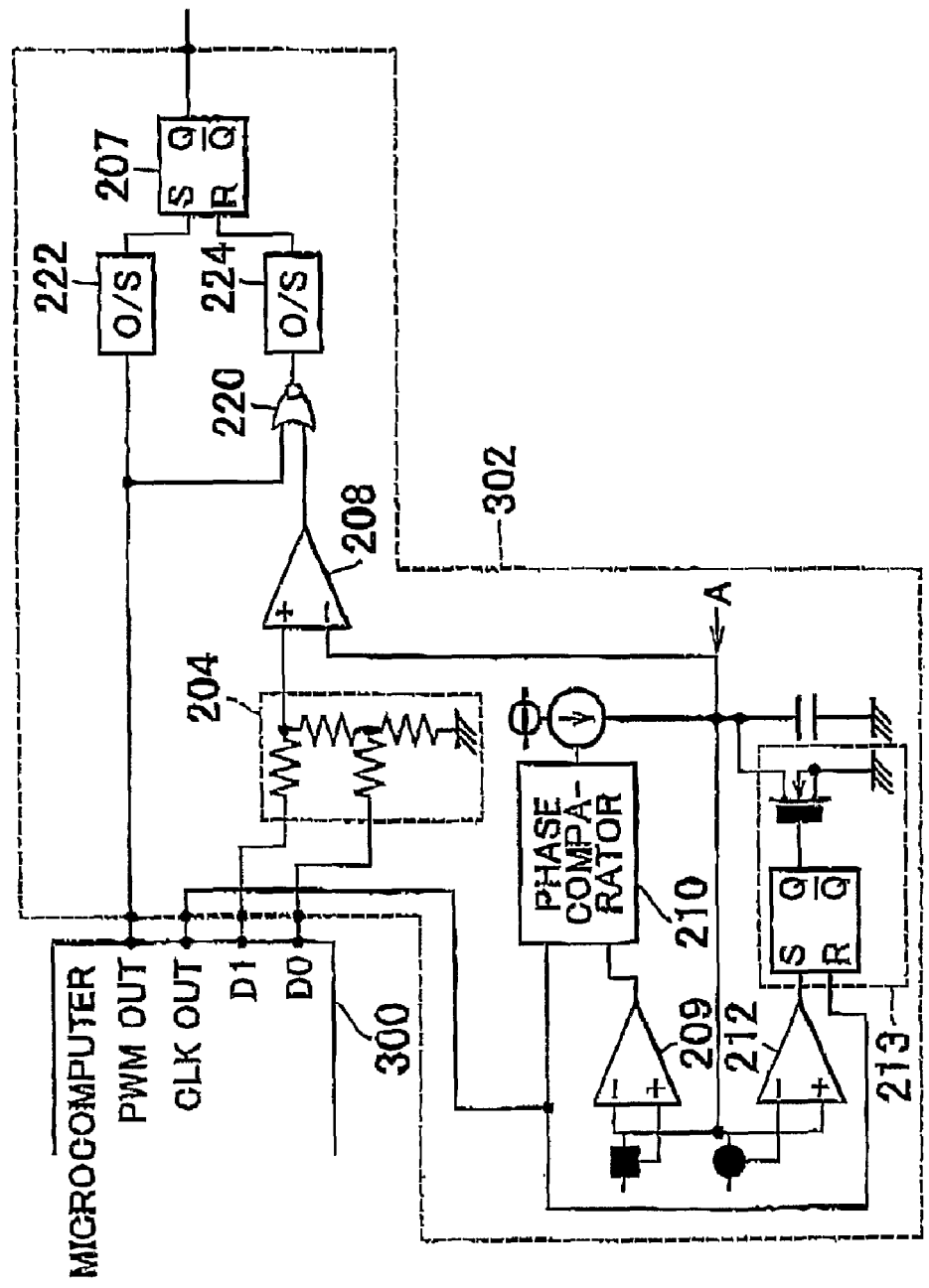
FIG. 6 is the view showing a PWM signal generating circuit according to another embodiment of the invention

Next, a PWM signal generating circuit according to another embodiment of the invention will be described with reference to FIG. 6.

In this embodiment of the invention, the resolution of the PWM signal (digital PWM signal) generated in a microcomputer 300 is increased by providing an external unit to the microcomputer 300 including a digital PWM signal generating circuit.

Only the features of this embodiment will be described below. The same or corresponding portions as those in the embodiment described above will be denoted by the same reference numerals, and will not be described below.

An external unit 302 receives a PWM signal output from the microcomputer 300, the clock signal CLK, and the outputs DR0, DR1 from the duty ratio setting registor 203.

The PWM signal is directly input in a one-shot circuit 222 and input in another one-shot circuit 224 via a NOR circuit 220. The output portion of the second comparator 208 is connected to the NOR circuit 220. The ramp wave and the outputs DR0, DR1 from the duty ratio setting register 203, which have been converted from digital data into analog data, are input in the second comparator 208. The clock signal CLK is used to generate the ramp wave that is synchronized with the PWM signal output from the microcomputer 300.

In this embodiment of the invention, with the same principle as that in the embodiment described above, the signals, of which the number equals to the number by which one cycle of the clock signal CLK of the PWM signal output from the microcomputer 300 is divided, can be generated using the output from the second comparator 208 that compares the ramp wave with the output from the D/A converter 204. Accordingly, it is possible to generate the high-resolution PWM signal without using a high-speed clock. Also, by externally providing the external unit 302 to the microcomputer 300, the resolution of the PWM signal output from the microcomputer 300 can be increased without re-configuration of the entire circuit. As a result, the function of the known microcomputer 300 can be easily extended.

In this embodiment of the invention, because the PWM signal output from the microcomputer 300 is influenced by retardation of the phase of the logic circuit, preferably, the phase of the ramp wave is advanced in order to compensate for the phase retardation in the phase comparator 210, instead of having the time at which the output of the ramp wave becomes ½ Vcc completely match the trailing edge of the clock signal CLK.

While the invention has been described with reference to example embodiments thereof, it is to be understood that the invention is not limited to the example embodiments or constructions. To the contrary, the invention is intended to cover various modifications and equivalent arrangements. In addition, while the various elements of the exemplary embodiments are shown in various combinations and configurations, which are exemplary, other combinations and configurations, including more, less or only a single element, are also within the spirit and scope of the invention.

For example, in the embodiments described above, the ramp wave, of which one cycle corresponds to one cycle of the clock signal CLK, is used. Alternatively, the ramp wave of which one cycle corresponds to two cycles of the clock signal (for example, the ramp wave of which the inclination when the voltage is increased equals to the inclination when the voltage is decreased) may be used. In this case, comparison may be made by the second comparator 208 while increases in the voltage of the ramp wave and decreases in the voltage of the ramp wave are distinguished from each other, whereby the same effects cane be obtained.

In the embodiments described above, the 2-bits at the low end of the digital information stored in the duty setting register 203 (2LSB) are converted into analog data and the analog data are input in the second comparator 208. Alternatively, other digital information stored in the duty setting register 203 may be converted into analog data and the analog data may be input in the second comparator 208.

Also, in the embodiments described above, the resolution is increased threefold or more by generating two or more voltage values (threshold values) based on the digital information. Alternatively, the resolution may be increased twofold using one voltage value (threshold value).

The invention claimed is:

1. A PWM resolution increase signal generating circuit, comprising:
    a common PWM signal generating circuit portion that generates a common digital PWM signal having a resolution of $2^n$ based on a clock signal CLK and n-bits ($n \geq 1$) of digital information;
    a triangular wave generator that generates a triangular wave synchronized with the clock signal CLK; and
    a comparator that compares the triangular wave with a threshold value, wherein
    the PWM resolution increase signal generating circuit increases the resolution of the common digital PWM signal based on an output from the comparator.

2. The PWM resolution increase signal generating circuit according to claim 1, wherein
    the PWM resolution increase signal generating circuit generates signals, of which a number equals to a number by which one cycle of the clock signal CLK is divided based on a result of comparison between the triangular wave and the threshold value.

3. The PWM resolution increase signal generating circuit according to claim 1, further comprising:
    a D/A converter that generates at least two threshold values based on at least 1-bit of digital information other than said n-bits, wherein
    the threshold values are input in the comparator.

4. The PWM resolution increase signal generating circuit according to claim 1, wherein
    the comparator outputs a signal, of which a duty ratio varies based on a result of comparison between the triangular wave and the threshold value.

5. The PWM resolution increase signal generating circuit according to claim 1, further comprising:
    a phase comparator that adjusts a difference in phase between the triangular wave and the clock signal CLK.

6. A high resolution PWM signal generating circuit, comprising:
    a counter that operates based on a clock signal CLK;
    a register that sets a duty ratio of a high resolution PWM signal;
    a first comparator that compares an output from the counter with an output from the register;
    a triangular wave generator that generates a triangular wave synchronized with the clock signal CLK; and
    a second comparator that compares the triangular wave with a threshold value, wherein
    the high resolution PWM signal generating circuit generates the high resolution PWM signal based on the output from the counter, an output from the first comparator, and an output from the second comparator.

7. The high resolution PWM signal generating circuit according to claim 6, wherein
    the register stores at least 1-bit of digital information that is compared with the output from the counter, and stores at least 1-bit of digital information used to generate at least two of said threshold value that are compared with the triangular wave.

8. The high resolution PWM signal generating circuit according to claim 6, wherein
    the second comparator outputs a signal indicating a result of the comparison of the triangular wave with the threshold value, and the high resolution PWM signal generating circuit generates signals having a number of a common digital PWM signal multiplied by a number by which one cycle of the clock signal CLK is divided based on the signal output from the second comparator.

9. The high resolution PWM signal generating circuit according to claim 6, further comprising:
    a phase comparator that adjusts a difference in phase between the triangular wave and the clock signal CLK.

* * * * *